US012500123B2

(12) United States Patent
Kano et al.

(10) Patent No.: US 12,500,123 B2
(45) Date of Patent: Dec. 16, 2025

(54) SUBSTRATE PROCESSING METHOD INCLUDING A BURR REMOVING PROCESS

(71) Applicant: DISCO CORPORATION, Tokyo (JP)

(72) Inventors: Tomohiro Kano, Tokyo (JP); Kenji Takenouchi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 464 days.

(21) Appl. No.: 17/661,067

(22) Filed: Apr. 28, 2022

(65) Prior Publication Data

US 2022/0367272 A1 Nov. 17, 2022

(30) Foreign Application Priority Data

May 11, 2021 (JP) ................................. 2021-080363

(51) Int. Cl.
*H01L 21/78* (2006.01)
*B23K 26/38* (2014.01)
(Continued)

(52) U.S. Cl.
CPC .............. *H01L 21/78* (2013.01); *B23K 26/38* (2013.01); *H01L 21/561* (2013.01);
(Continued)

(58) Field of Classification Search
CPC ........... H01L 21/3043; H01L 21/67092; H01L 21/463; H01L 21/30604; H01L 21/78;
(Continued)

(56) References Cited

U.S. PATENT DOCUMENTS 3,535,159 A * 10/1970 Shiro ........................ B08B 3/12
   451/36
6,162,366 A   12/2000 Ishikura et al.
(Continued)

FOREIGN PATENT DOCUMENTS

CN         112259450 A  *  1/2021   ....... H01L 21/30604
DE     102019212183 A1     3/2020
(Continued)

OTHER PUBLICATIONS

K. R. Williams, K. Gupta and M. Wasilik, "Etch rates for micromachining processing—Part II," in Journal of Microelectromechanical Systems, vol. 12, No. 6, pp. 761-778, Dec. 2003, doi: 10.1109/JMEMS.2003.820936. (Year: 2003).*
(Continued)

*Primary Examiner* — Lex H Malsawma
(74) *Attorney, Agent, or Firm* — Greer, Burns & Crain, Ltd

(57) ABSTRACT

Provided is a method for processing a substrate having a metal formed on a planned dividing line along the planned dividing line, the method including a processed groove forming step of forming a processed groove in the substrate along the planned dividing line, and a burr removing step of, after the processed groove forming step is performed, making an etchant that includes at least an oxidizing agent and to which an ultrasonic vibration is imparted come into contact with the substrate, suppressing ductility of a metallic burr generated on a periphery of the formed processed groove and increasing fragility of the burr by modifying the burr by the oxidizing agent included in the etchant, and removing the burr by the ultrasonic vibration.

7 Claims, 3 Drawing Sheets

(51) Int. Cl.
- *H01L 21/56* (2006.01)
- *H01L 21/67* (2006.01)
- *H01L 21/304* (2006.01)
- *H01L 21/306* (2006.01)
- *H01L 23/00* (2006.01)

(52) U.S. Cl.
CPC .. *H01L 21/67086* (2013.01); *H01L 21/67092* (2013.01); *H01L 21/3043* (2013.01); *H01L 21/30604* (2013.01); *H01L 24/97* (2013.01); *H01L 2221/68331* (2013.01); *H01L 2224/97* (2013.01)

(58) Field of Classification Search
CPC ........... H01L 21/67086; H01L 21/3063; H01L 21/3064; H01L 21/30635; B23K 26/38
See application file for complete search history.

(56) References Cited

U.S. PATENT DOCUMENTS

| | | | | |
|---|---|---|---|---|
| 9,679,789 | B2 * | 6/2017 | Obata | H01L 21/67092 |
| 11,101,151 | B2 * | 8/2021 | Takenouchi | H01L 21/56 |
| | | | | 438/460 |
| 2009/0137118 | A1 * | 5/2009 | Hirota | H01L 21/67086 |
| | | | | 257/E21.228 |
| 2015/0162222 | A1 * | 6/2015 | Obata | H01L 21/78 |
| | | | | 134/184 |
| 2015/0262881 | A1 * | 9/2015 | Takenouchi | B28D 5/022 |
| | | | | 438/460 |
| 2018/0330990 | A1 | 11/2018 | Takenouchi | |
| 2020/0058525 | A1 * | 2/2020 | Takenouchi | H01L 21/67023 |
| 2021/0351030 | A1 * | 11/2021 | Hirikiri | H01L 21/30604 |

FOREIGN PATENT DOCUMENTS

| | | | | |
|---|---|---|---|---|
| JP | 2002105225 | A * | 4/2002 | ......... B81C 1/00555 |
| JP | 2004356593 | A * | 12/2004 | |
| JP | 2007125667 | A | 5/2007 | |
| JP | 2008205369 | A * | 9/2008 | ........ H01L 21/31111 |
| JP | 2010090417 | A | 4/2010 | |
| JP | 2018190852 | A | 11/2018 | |

OTHER PUBLICATIONS

Pernel et al., Copper in organic acid based cleaning solutions (Year: 2006).*

Orouji et al., Controlled oxidation of mild steel by potassium permanganate solution to enhance protective functioning of silane coatings (Year: 2020).*

Office Action issued in counterpart German patent application No. 10 2022 204 352.9, dated Jul. 16, 2024.

Search Report issued by the IP Office of Singapore in corresponding Patent Application No. 10 2022 204 352.9, dated Nov. 1, 2024.

Japan Patent Application 2021-080363: English translation of Office Action, Jan. 28, 2025 (3 pages).

* cited by examiner

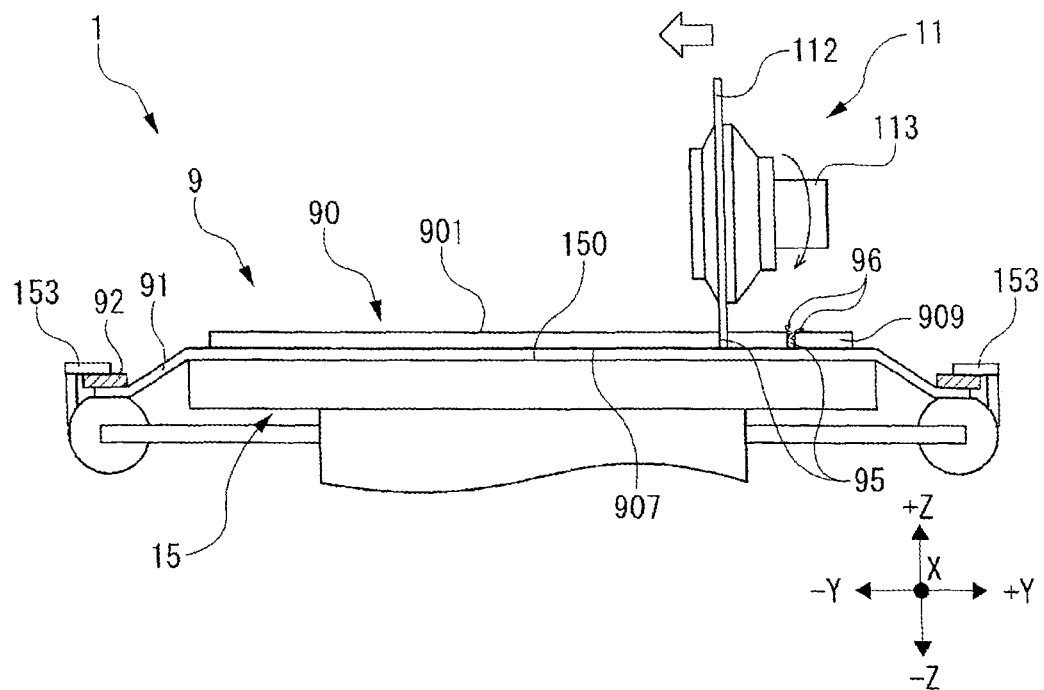
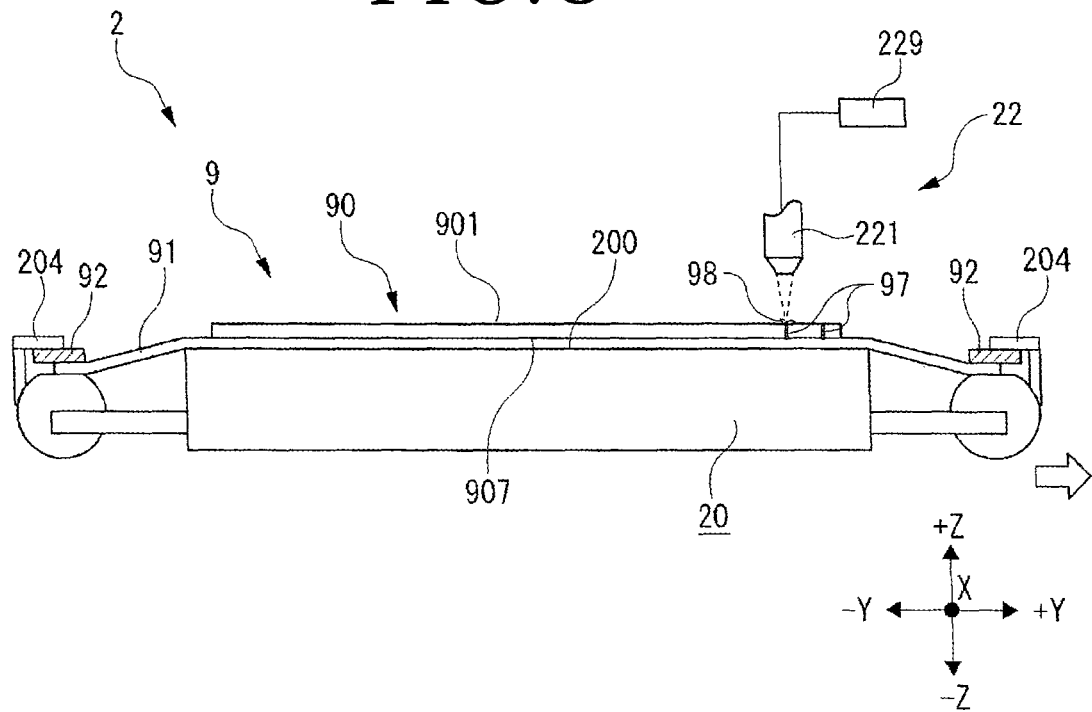

SUBSTRATE PROCESSING METHOD INCLUDING A BURR REMOVING PROCESS

BACKGROUND OF THE INVENTION

Field of the Invention

The present invention relates to a substrate processing method for processing a substrate having a metal formed on planned dividing lines along the planned dividing lines.

Description of the Related Art

In a case of forming processed grooves in a substrate including metallic parts, a metallic film, wiring formed by metal, or the like, burrs are produced on the metallic parts, and cause such problems as a short circuit between chip terminals due to the produced burrs and occurrence of a bonding failure due to, for example, the falling of the burrs onto bonding pads during the handling of a workpiece. Accordingly, an apparatus which jets high pressure water from a nozzle to the burrs and thereby removes the burrs has been proposed (see Japanese Patent Laid-Open No. 2007-125667, for example).

SUMMARY OF THE INVENTION

However, it is difficult to properly remove the burrs on the peripheries of the processed grooves even by using the technology disclosed in Japanese Patent Laid-Open No. 2007-125667, and a human performs the work of inspecting the processed grooves and removing the burrs after the formation of the processed grooves, resulting in inefficiency.

It is accordingly an object of the present invention to provide a substrate processing method that can properly remove burrs from a fully cut or half cut substrate and improve the work efficiency of burr removal in a case of processing the substrate having a metal formed on planned dividing lines along the planned dividing lines.

In accordance with an aspect of the present invention, there is provided a substrate processing method for processing a substrate having a metal formed on a planned dividing line along the planned dividing line, the substrate processing method including a processed groove forming step of forming a processed groove in the substrate along the planned dividing line, and a burr removing step of, after the processed groove forming step is performed, making an etchant that includes at least an oxidizing agent and to which an ultrasonic vibration is imparted come into contact with the substrate, suppressing ductility of a metallic burr produced on a periphery of the formed processed groove and increasing fragility of the burr by modifying the burr by the oxidizing agent included in the etchant, and removing the burr by the ultrasonic vibration.

Preferably, the etchant further includes an organic acid. Preferably, the etchant further includes an anticorrosive.

Preferably, the burr removing step immerses the substrate in which the processed groove is formed or a plurality of chips divided as individual pieces by the processed grooves in a tank retaining the etchant and including an ultrasonic oscillating unit that imparts the ultrasonic vibration.

Preferably, a rate at which the burrs are etched is controlled by a composition ratio of the etchant including the oxidizing agent and at least either the organic acid or the anticorrosive.

According to the present invention, it is possible to remove the burrs excellently, and to improve the work efficiency of burr removal.

When the etchant used in the burr removing step further includes the organic acid in addition to the oxidizing agent, the effect of etching for burr removal can be increased.

When the etchant used in the burr removing step further includes the anticorrosive in addition to the oxidizing agent, unnecessary etching of device surfaces of the chips can be retarded.

When the burr removing step immerses the substrate in which the processed grooves are formed or the plurality of chips divided as individual pieces by the processed grooves in the tank retaining the etchant and including the ultrasonic oscillating unit that imparts the ultrasonic vibration, the burrs can be removed excellently in a short period of time.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 2 is a side view of assistance in explaining an example of a processed groove forming step of forming processed grooves in the substrate along planned dividing lines by blade dicing;

FIG. 3 is a side view of assistance in explaining another example of the processed groove forming step of forming the processed grooves in the substrate along the planned dividing lines by laser dicing.

DETAILED DESCRIPTION OF THE PREFERRED EMBODIMENTS

Figure 1:
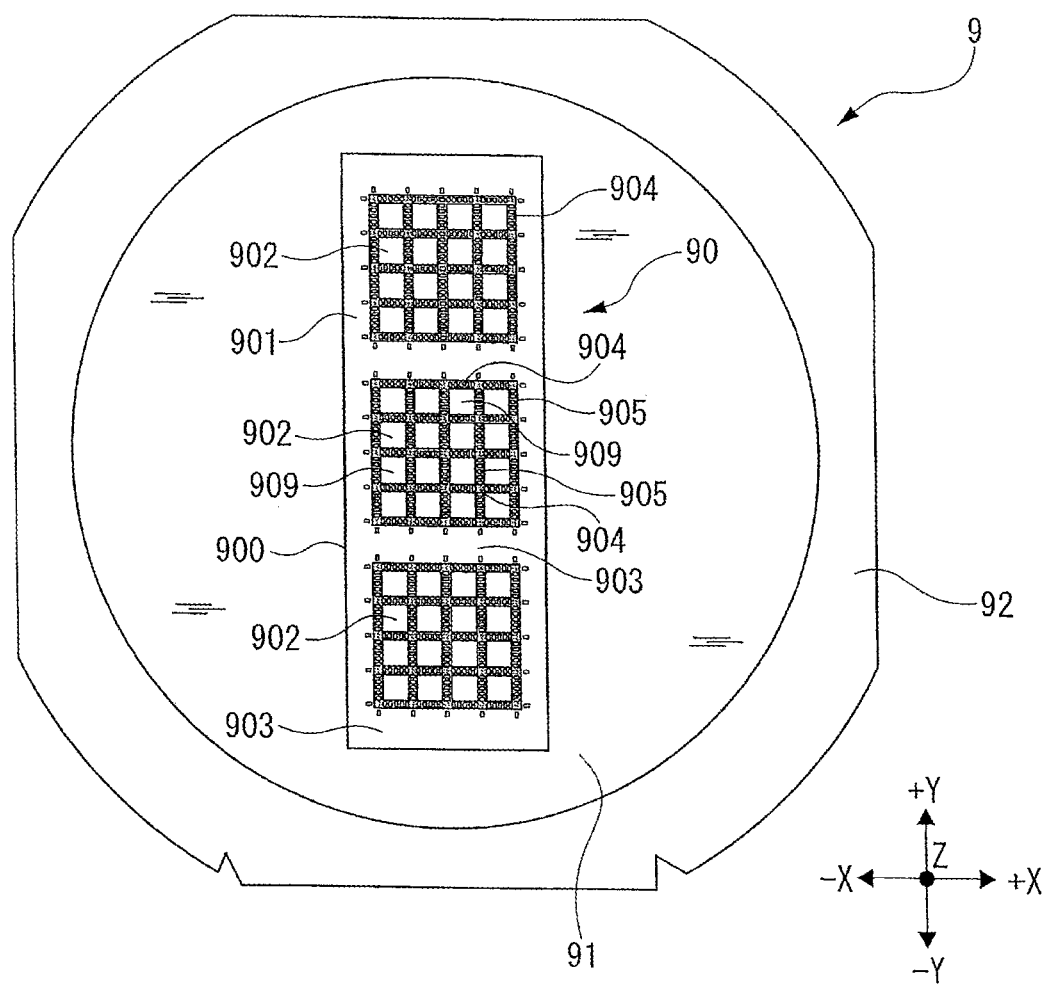
FIG. 1 is a plan view illustrating an example of a substrate to be subjected to processing.

A semiconductor is made by using a substrate 90 illustrated in FIG. 1 which is to be subjected to division processing is, for example, a quad flat non-leaded package (QFN) substrate. The substrate 90 has a frame plate 900 having a rectangular external shape. A plurality of device regions 902 (three device regions 902 in the example illustrated in FIG. 1) that become individual chips 909 including semiconductor devices by being divided are formed side by side in a longitudinal direction of the substrate 90 on a top surface 901 of the substrate 90 illustrated in FIG. 1. The periphery of each of the device regions 902 is surrounded by end material parts 903 to be formed in small pieces and discarded.

The device regions 902 are demarcated by a plurality of planned dividing lines 904 orthogonal to one another. Metals 905 that constitute a plurality of electrode pads or the like connected to the unillustrated respective devices are arranged on the planned dividing lines 904. The metals 905 are insulated from each other by an unillustrated mold resin on the frame plate 900. When the centers of the plurality of metals 905 are cut along the planned dividing lines 904, the substrate 90 is divided into the chips 909 having the mold resin sealing the unillustrated devices and the plurality of cut metals 905. Incidentally, an oxide film of $SiO_2$ or the like or a resin film having a thickness in μm units, for example, may be formed as a device protective film on the device region 902.

As illustrated in FIG. 2, for example, an undersurface 907 (see FIG. 2) of the substrate 90 is affixed to the affixing surface (top surface) of a dicing tape 91. An outer circumferential portion of the dicing tape 91 is affixed to an annular frame 92 illustrated in FIG. 1 and FIG. 2. Thus, the substrate 90 is supported by the annular frame 92 via the dicing tape 91, and constitutes a frame unit 9 that can be handled by use of the annular frame 92. The center of the annular frame 92 and the center of the substrate 90 substantially coincide with each other.

Incidentally, the substrate 90 to be subjected to processing may be in a state of including only the substrate rather than the frame unit 9. In addition, for example, test element groups (TEGs) formed of metal such as aluminum or copper and formed by a combination of a transistor, a resistance, and the like may be formed at predetermined intervals on the planned dividing lines 904 of the substrate 90. The TEGs are electrically connected to the chips 909 that are divided and include the devices through an unillustrated wiring layer which is formed of metal or the like.
Incidentally, the metals formed on the planned dividing lines 904 of the substrate 90 may be wiring other than that in the above-described example. The substrate 90 may be a package substrate in which devices are laminated to the top surface of a metal substrate other than a QFN substrate and are sealed with resin, or the substrate 90 may be a package substrate in which a metallic film as a heat sink covers the top surface of a substrate on which planned dividing lines are formed.

(1-1) First Embodiment of Processed Groove Forming Step

A cutting apparatus 1 illustrated in FIG. 2 is an apparatus that can perform cutting processing on the substrate 90. The cutting apparatus 1 includes at least a holding unit 15 that holds the substrate 90 and a cutting unit 11 that cuts the substrate 90 by a rotatable cutting blade 112. Incidentally, in FIG. 2, the structure of the frame unit 9 is partly illustrated in a simplified manner.

The holding unit 15, for example, has a flat holding surface 150 that holds the substrate 90. The holding unit 15 can be rotated about a rotational axis in a vertical direction (Z-axis direction), and can be reciprocated in an X-axis direction (directions of a front and a back of a paper plane) by unillustrated cutting feed means. The holding unit 15 may be a porous chuck whose holding surface 150 is formed of a porous material, or may be a jig chuck having blade clearance grooves in the holding surface 150. In addition, on the periphery of the holding unit 15 illustrated in FIG. 2, four fixing clamps 153 that can hold and fix the annular frame 92 in a case where the substrate 90 constitutes the frame unit 9 as in the present embodiment are arranged uniformly at equal intervals in a circumferential direction, for example.

The cutting unit 11 can be indexing-fed in a Y-axis direction and can be cutting-fed in the Z-axis direction (vertical direction). The cutting unit 11, for example, includes at least the cutting blade 112 that cuts into the substrate 90 while being rotated, a rotatable spindle 113 that supports the cutting blade 112 fitted to a distal end thereof, and an unillustrated motor. The cutting blade 112 may be an annular washer blade, or may be a hub blade.

Unillustrated alignment means for detecting a planned dividing line 904 (see FIG. 1) of the substrate 90 held by the holding unit 15 is disposed, for example, in the vicinity of the cutting unit 11. The alignment means can detect the position of the planned dividing line 904 of the top surface 901 by image processing such as pattern matching, in reference to an imaged image of the top surface 901 of the substrate 90.

In a processed groove forming step in which blade dicing is performed, first, the substrate 90 constituting the frame unit 9 is mounted on the holding surface 150 of the holding unit 15, and a suction force produced by an unillustrated suction source is transmitted to the holding surface 150, so that the substrate 90 is held under suction on the holding surface 150. The center of the substrate 90 and the center of the holding surface 150 substantially coincide with each other. In addition, the annular frame 92 of the frame unit 9 is held and fixed by the fixing clamps 153.

The holding unit 15 that holds the substrate 90 is rotated such that the longitudinal direction of the substrate 90 becomes the X-axis direction, for example. Next, the holding unit 15 holding the substrate 90 is fed in a −X direction (back side of the paper plane), and the unillustrated alignment means detects the coordinate position in the Y-axis direction of a target planned dividing line 904 into which the cutting blade 112 is to be made to cut and which extends in the X-axis direction.

Next, the target planned dividing line 904 and the cutting blade 112 are aligned with each other in the Y-axis direction, and the cutting blade 112 is rotated at high speed in a counterclockwise direction as viewed from a +Y direction side, for example. Further, the cutting unit 11 is cutting-fed in a −Z direction, and a lowermost end of the cutting blade 112 is positioned to a height position at which the cutting blade 112 fully cuts the substrate 90 and slightly cuts into the dicing tape 91. Incidentally, the substrate 90 may be half cut.

When the substrate 90 illustrated in FIG. 2 is further fed in the −X direction (back side of the paper plane) at a predetermined cutting feed speed, the cutting blade 112 cuts into the substrate 90 along the planned dividing line 904, and cuts the substrate 90 while forming a processed groove 95 illustrated in FIG. 2. The metal 905 such as an electrode pad is disposed on the planned dividing line 904 illustrated in FIG. 1. Thus, the metal 905 becomes a whisker-shaped burr 96 illustrated in FIG. 2, for example, due to ductility of the metal 905, and the burr 96 is formed on the periphery of the processed groove 95, that is, the inner surface of the processed groove 95 and upper end parts of the processed groove 95.

When the frame unit 9 is fed to a predetermined position on the −X direction side at which position the cutting blade 112 illustrated in FIG. 2 completes the cutting of the one planned dividing line 904, the cutting feeding of the substrate 90 is stopped temporarily, the cutting blade 112 is separated from the substrate 90, and then the substrate 90 is moved in a +X direction and returned to an origin position. Then, similar cutting is sequentially performed while the cutting blade 112 is indexing-fed in a −Y direction at intervals of the planned dividing lines 904 adjacent to each other. The substrate 90 is thereby cut along all of the planned dividing lines 904 in the X-axis direction.

Further, the holding unit 15 is rotated by 90 degrees, and similar cutting is performed. Consequently, all of the planned dividing lines 904 are cut longitudinally and laterally, and the substrate 90 is divided into the chips 909 including the devices.

(1-2) Second Embodiment of Processed Groove Forming Step

Instead of the formation of the processed grooves 95 in the substrate 90 by the above-described cutting, the processed groove forming step may be performed by using a laser processing apparatus 2 illustrated in FIG. 3, for example. The laser processing apparatus 2 includes at least a chuck table 20 that holds under suction the substrate 90 and a laser beam irradiating unit 22 that can irradiate the substrate 90 held on the chuck table 20 with a laser beam of a wavelength that is, for example, absorbable by the substrate 90.

The chuck table 20 that communicates with an unillustrated suction source and has a flat holding surface 200 can be rotated, and can be reciprocated in the X-axis direction as a processing feed direction and the Y-axis direction as an indexing feed direction by unillustrated moving means.

The laser beam irradiating unit 22 makes the laser beam emitted from a laser oscillator 229 enter an unillustrated condensing lens in a condenser 221 via a transmission optical system. The laser beam irradiating unit 22 can thereby accurately condense and apply the laser beam to a target position of the substrate 90 held by the chuck table 20. The height position of a condensing point of the laser beam can be adjusted in the Z-axis direction by unillustrated condensing point position adjusting means.

In the laser processing apparatus 2, the substrate 90 is held under suction on the holding surface 200 of the chuck table 20 in a state in which the top surface 901 is oriented upward. In addition, the annular frame 92 is held and fixed by fixing clamps 204 arranged on the chuck table 20. Next, the position of a planned dividing line 904 as a reference for applying the laser beam is detected by unillustrated alignment means. Then, the chuck table 20 is indexing-fed in the Y-axis direction, and the planned dividing line 904 to be irradiated with the laser beam and the condenser 221 are aligned with each other in the Y-axis direction.

Further, the height position of the condensing point of the laser beam condensed by the unillustrated condensing lens is set to the height position of the top surface 901 of the substrate 90, for example. Then, the laser oscillator 229 emits the laser beam of a wavelength absorbable by the substrate 90, and condenses and applies the laser beam to the planned dividing line 904.

In addition, the substrate 90 is fed in the −X direction (back side of the paper plane) as a forward direction at a predetermined processing feed speed, the laser beam is applied to the top surface 901 of the substrate 90 along the planned dividing line 904, and the substrate 90 is subjected to ablation from the top surface 901 to the undersurface 907, so that a processed groove 97 that severs the substrate 90, for example, is formed along the planned dividing line 904. Incidentally, the processed groove 97 may be a half cut groove. At the same time as this, because the metal 905 such as an electrode pad is disposed on the planned dividing line 904 illustrated in FIG. 1, the metal 905 is formed as a molten burr 98 on the periphery of the processed groove 97, that is, the inner surface of the processed groove 97 and upper end parts of the processed groove 97.

The application of the laser beam is stopped when the substrate 90 is advanced in the −X direction to a predetermined position at which the application of the laser beam along the planned dividing line 904 is to be ended. Further, the chuck table 20 is indexing-fed in a +Y direction by a predetermined distance, and the condensing point of the condenser 221 is positioned on a next target planned dividing line 904. Then, the substrate 90 is processing-fed in the +X direction (near side of the paper plane) as a return direction, and as in the application of the laser beam in the forward direction, the substrate 90 is subjected to ablation along the planned dividing line 904, so that a processed groove 97 is formed along the planned dividing line 904. Then, similar laser processing is sequentially performed while the chuck table 20 is indexing-fed in the −Y direction at intervals of the planned dividing lines 904 adjacent to each other. The substrate 90 is thereby cut along all of the planned dividing lines 904 extending in the X-axis direction. Incidentally, the laser irradiation of one planned dividing line 904 may be performed in two passes or more.

Further, the chuck table 20 is rotated by 90 degrees, and similar laser processing is performed. Consequently, all of the planned dividing lines 904 are cut longitudinally and laterally, and the substrate 90 is divided into the chips 909 including the devices.

(2) Burr Removing Step

Figure 4:
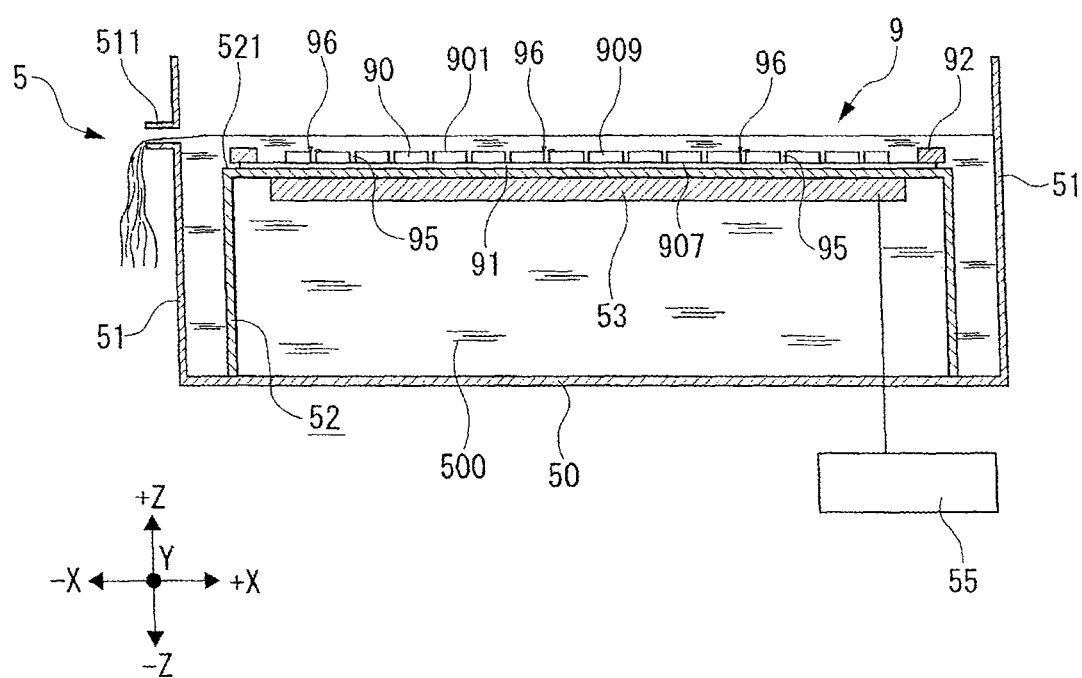
FIG. 4 is a sectional view of assistance in explaining an example of a burr removing step using a tank that retains an etchant.

After the processed groove forming step in the first embodiment or the processed groove forming step in the second embodiment is performed, the frame unit 9 is transported to a tank 5 illustrated in FIG. 4. The tank 5 in which, for example, the whole of the substrate 90 supported by the annular frame 92 can be immersed includes side walls 51 and a bottom plate 50 integrally connected to lower portions of the side walls 51. The tank 5 stores an etchant 500.

A mounting table 52 is disposed on the bottom plate 50. The mounting table 52 has a mounting surface 521 parallel with an X-axis and Y-axis plane. The frame unit 9 is mounted on the mounting surface 521. The tank 5 is supplied with the etchant 500 from an unillustrated etchant supply source. The tank 5 has, in a side wall 51, for example, a drainage port 511 for discharging the etchant 500. The drainage port 511 is disposed at a position higher than the mounting surface 521 of the mounting table 52 and higher than the upper surface of the frame unit 9 mounted on the mounting surface 521. The whole of the frame unit 9 mounted on the mounting surface 521 is thus immersed in the etchant 500 retained in the tank 5. The tank 5 is supplied with a new etchant 500 from the unillustrated etchant supply source. The old etchant 500 is sequentially drained from the drainage port 511.

An ultrasonic oscillating unit 53 formed in a disk shape by arrangement of a plurality of piezoelectric elements, for example, is disposed on the lower (−Z direction side) surface of the mounting surface 521. An unillustrated terminal is connected to the ultrasonic oscillating unit 53. A voltage applying unit 55 that applies an alternating-current voltage is connected to the ultrasonic oscillating unit 53 via the terminal and wiring. It is to be noted that the shape, arrangement position, and the like of the ultrasonic oscillating unit 53 are not limited to those in this example. An ultrasonic wave generated by the ultrasonic oscillating unit 53 vibrates the mounting surface 521, and acts on the frame unit 9 mounted on the mounting surface 521, from a lower side. It is not desirable for the frame unit 9 to be in direct contact with the ultrasonic oscillating unit 53 in the tank 5. Hence, the mounting surface 521 is interposed between the frame unit 9 and the ultrasonic oscillating unit 53.

The etchant 500 includes at least an oxidizing agent. In the present embodiment, the etchant 500 further includes an organic acid and an anticorrosive.

Usable as the organic acid is, for example, a compound having at least one carboxyl group and at least one amino group within a molecule. In this case, at least one amino group is preferably a secondary or tertiary amino group. In addition, the compound used as the organic acid may have a substituent.

Amino acids that can be used as the organic acid include glycine, dihydroxyethylglycine, glycylglycine, hydroxyethylglycine, N-methylglycine, β-alanine, L-alanine, L-2-aminobutyric acid, L-norvaline, L-valine, L-leucine, L-norleucine, L-alloisoleucine, L-isoleucine, L-phenylalanine, L-proline, sarcosine, L-ornithine, L-lysine, taurine, L-serine, L-threonine, L-allothreonine, L-homoserine, L-thyroxine L-tyrosine, 3, 5-diiodo-L-tyrosine, β-(3, 4-dihydroxyphenyl)-L-alanine, 4-hydroxy-L-proline, L-cysteine, L-methionine, L-ethionine, L-lanthionine, L-cystathionine, L-cystine, L-cysteic acid, L-glutamic acid, L-aspartic acid, S-(carboxymethyl)-L-cysteine, 4-aminobutyric acid, L-asparagine, L-glutamine, azaserine, L-canavanine, L-citrulline, L-arginine, δ-hydroxy-L-lysine, creatine, L-kynurenine, L-histidine, 1-methyl-L-histidine, 3-methyl-L-histidine, L-tryptophan, actinomycin C1, ergothioneine, apamin, angiotensin I, angiotensin II, antipain, and the like. In particular, glycine, L-alanine, L-proline, L-histidine, L-lysine, and dihydroxyethylglycine are preferable.

In addition, amino polyacids that can be used as the organic acid include iminodiacetic acid, nitrilotriacetic acid, diethylenetriaminepentaacetic acid, ethylenediaminetetraacetic acid, hydroxyethyliminodiacetic acid, nitrilotrismethylenephosphonic acid, ethylenediamine-N, N, N', N'-tetramethylenesulfonic acid, 1, 2-diaminopropanetetraacetic acid, glycol etherdiaminetetraacetic acid, transcyclohexanediaminetetraacetic acid, ethylenediamine orthohydroxyphenylacetic acid, ethylenediamine disuccinic acid (SS form), β-alanine diacetic acid, N-(2-carboxylateethyl)-L-aspartic acid, N, N'-bis (2-hydroxy Benzyl) ethylenediamine-N, N'-diacetic acid, and the like.

Further, carboxylic acids that can be used as the organic acid include formic acid, glycolic acid, propionic acid, acetic acid, butyric acid, valeric acid, hexanoic acid, oxalic acid, malonic acid, glutaric acid, adipic acid, malic acid, succinic acid, pimelic acid, mercaptoacetic acid, glyoxylic acid, chloroacetic acid, pyruvic acid, acetoacetic acid, glutaric acid, and other saturated carboxylic acids, acrylic acid, methacrylic acid, crotonic acid, fumaric acid, maleic acid, mesaconic acid, citraconic acid, aconitic acid, and other unsaturated carboxylic acids, benzoic acids, toluic acid, phthalic acids, naphthoic acids, pyromellitic acid, naphthalic acid, and other cyclic unsaturated carboxylic acids, and the like.

Usable as the oxidizing agent are, for example, hydrogen peroxide, peroxides, nitrate, iodate, periodate, hypochlorite, chlorite, chlorate, perchlorate, persulfate, dichromate, permanganate, cerate, vanadate, ozone water, silver (II) salt, iron (III) salt, organic complex salts thereof, and the like.

In addition, preferably used as the anticorrosive are, for example, a heteroaromatic ring compound having three or more nitrogen atoms within a molecule and having a fused ring structure or a heteroaromatic ring compound having four or more nitrogen atoms within a molecule. Further, an aromatic ring compound preferably includes a carboxyl group, a sulfo group, a hydroxy group, or an alkoxy group. Specifically, the aromatic ring compound is preferably a tetrazole derivative, a 1, 2, 3-triazole derivative, or a 1, 2, 4-triazole derivative.

Tetrazole derivatives that can be used as the anticorrosive include ones that have no substituent on a nitrogen atom forming a tetrazole ring and that are obtained by introducing, at position 5 of a tetrazole, a substituent selected from a group including a sulfo group, an amino group, a carbamoyl group, a carbonamide group, a sulfamoyl group, and a sulfonamide group or an alkyl group replaced with at least one substituent selected from a group including a hydroxy group, a carboxy group, a sulfo group, an amino group, a carbamoyl group, a carbonamide group, a sulfamoyl group, and a sulfonamide group.

In addition, 1, 2, 3-triazole derivatives that can be used as the anticorrosive include ones that have no substituent on a nitrogen atom forming a 1, 2, 3-triazole ring and that are obtained by introducing, at position 4 and/or position 5 of a 1, 2, 3-triazole, a substituent selected from a group including a hydroxy group, a carboxy group, a sulfo group, an amino group, a carbamoyl group, a carbonamide group, a sulfamoyl group, and a sulfonamide group or an alkyl group or an aryl group replaced with at least one substituent selected from a group including a hydroxy group, a carboxy group, a sulfo group, an amino group, a carbamoyl group, a carbonamide group, a sulfamoyl group, and a sulfonamide group.

In addition, 1, 2, 4-triazole derivatives that can be used as the anticorrosive include ones not having a substituent on a nitrogen atom forming a 1, 2, 4-triazole ring and obtained by introducing, at position 2 and/or position 5 of a 1, 2, 4-triazole, a substituent selected from a group including a sulfo group, a carbamoyl group, a carbonamide group, a sulfamoyl group, and a sulfonamide group or an alkyl group or an aryl group replaced with at least one substituent selected from a group including a hydroxy group, a carboxy group, a sulfo group, an amino group, a carbamoyl group, a carbonamide group, a sulfamoyl group, and a sulfonamide group.

In a burr removing step in the present embodiment, as illustrated in FIG. 4, for example, the frame unit 9 is immersed in the etchant 500 of the tank 5 such that the substrate 90 is oriented upward, and the frame unit 9 is mounted on the mounting surface 521 of the mounting table 52. Then, a predetermined voltage is applied from the voltage applying unit 55 to the ultrasonic oscillating unit 53, and the ultrasonic oscillating unit 53 oscillates an ultrasonic wave of a predetermined frequency by mechanically vibrating mainly in an upward-downward direction. Then, the oscillated ultrasonic wave is propagated to the substrate 90 divided into the chips 909, via the etchant 500.

The burrs 96 (or the burrs 98 illustrated in FIG. 3) formed of metal which are formed on the periphery of the processed grooves 95 (or the processed grooves 97 illustrated in FIG. 3) of the substrate 90 are modified (oxidized) by the oxidizing agent included in the etchant 500, and the ductility of the metal is lowered. That is, the burrs 96 (or the burrs 98 illustrated in FIG. 3) become fragile with respect to ultrasonic vibration. Then, in the present embodiment, the burrs 96 (or the burrs 98 illustrated in FIG. 3) are etched by the etchant 500 including the organic acid, to be further thinned in parallel with the increase in fragility. As a result, the ultrasonic vibration propagated from the etchant 500 removes the burrs 96 (burrs 98) from the chips 909.

Incidentally, in the burr removing step, a rate at which the burrs 96 are etched is controlled by a composition ratio of the etchant 500 including the oxidizing agent, the organic acid, and the anticorrosive, for example. That is, while there is a possibility of the etchant 500 etching and damaging metallic parts and metallic wiring as product parts constituting the device chips 909, it is possible to prevent damage to the device chips 909 and efficiently remove the burrs 96 (burrs 98) from the chips 909 by controlling the composition ratio of the etchant 500 including the oxidizing agent, the organic acid, and the anticorrosive and controlling a length of time for which the substrate 90 is immersed in the etchant 500.

This is because most of the burrs 96 formed of metal are formed to project from the chips 909 in such a manner as to be elongated toward ends thereof. A decrease in ductility and an increase in fragility of the burrs 96 due to the oxidizing agent included in the etchant 500 progress faster than in product parts of the chips 909. Further, the thin burrs 96 (burrs 98) are vibrated and rendered susceptible to breaking by ultrasonic vibration being imparted to the burrs 96. Thus, the removal of the burrs 96 (burrs 98) can be completed efficiently in a stage before the product parts of the device chips 909 are damaged. In addition, for example, in general, a device protective film such as an oxide film is often formed on the top surfaces of the device chips 909 in advance. The top surfaces of the device chips 909 are hence less likely to be subjected to damage by the etchant 500 than the parts of the burrs 96 (burrs 98).

In a case of, for example, bonding and fixing the substrate 90 to a substrate (carrier substrate) of high rigidity which is formed of glass, silicon, or the like, and performing the processed groove forming step in the foregoing first embodiment or the processed groove forming step in the second embodiment, the substrate 90 divided into the chips 909 may be immersed in the tank 5 together with the carrier substrate in the burr removing step.

In addition, in a case of forming half cut grooves instead of completely cutting the substrate 90 in the processed groove forming step in the foregoing first embodiment or the processed groove forming step in the second embodiment, only the undivided substrate 90 may be immersed in the tank 5. Alternatively, for example, the plurality of chips 909 obtained by dividing the QFN substrate 90 into individual pieces may be immersed in the tank 5 as they are, with the tape support being cancelled.

The ultrasonic oscillating unit 53 disposed in the tank 5 is not limited to the one having the disk shape illustrated in FIG. 4. For example, the ultrasonic oscillating unit may be disposed as an ultrasonic horn that expands or contracts in the Z-axis direction such that the ultrasonic horn is immersed in an upper part of the tank 5. An ultrasonic vibration may be propagated to the etchant 500 while the ultrasonic horn is moved longitudinally and laterally along the processed grooves 95 (processed grooves 97) of the substrate 90 mounted on the mounting table 52. The burrs 96 (burrs 98) of metal which are produced on the peripheries of the processed grooves 95 (processed grooves 97) may be modified by the oxidizing agent included in the etchant 500, to suppress ductility of the burrs 96 (burrs 98) and increase fragility of the burrs 96 (burrs 98), and the burrs 96 (burrs 98) may be removed by the ultrasonic vibration.

Incidentally, the ultrasonic vibration propagated in the etchant 500 travels in the −Z direction, reaches the bottom plate 50 of the tank 5, is thereafter reflected by the bottom plate 50, and returns to a liquid surface side. Consequently, an ultrasonic wave that goes to the bottom plate 50 (incident wave) and an ultrasonic wave that is reflected from the bottom plate 50 and that returns to the liquid surface side (reflected wave) are superimposed on each other, and a depth of strong sound pressure and a depth of weak sound pressure are generated in the etchant 500. A depth of highest sound pressure in the etchant 500 is present at fixed intervals in the Z-axis direction from the liquid surface according to the frequency of the ultrasonic waves. Hence, a depth at which sound pressure becomes the highest in the Z-axis direction in the etchant 500 from the liquid surface in a case where the liquid surface is set as a zero position is measured. Then, the above-described ultrasonic vibration may be imparted after the height position of the substrate 90 mounted on the mounting table 52 is set to the depth at which sound pressure becomes the highest in the Z-axis direction in the etchant 500.

Incidentally, for example, the ultrasonic oscillating unit 53 may be disposed on the upper surface of the bottom plate 50, and frame mounting bases on which the annular frame 92 of the frame unit 9 is to be mounted may be arranged uniformly at predetermined intervals in the circumferential direction on a region outside the region of the upper surface of the bottom plate 50 on which region the ultrasonic oscillating unit 53 is disposed. Then, the frame unit 9 is immersed in the etchant 500 of the tank 5 in an orientation in which the ultrasonic oscillating unit 53 and the top surface 901 of the substrate 90 face each other, and the annular frame 92 is mounted on the upper surfaces of the frame mounting bases. Then, a voltage is applied from the voltage applying unit 55 to the ultrasonic oscillating unit 53. An ultrasonic vibration is thereby imparted from the ultrasonic oscillating unit 53 to the etchant 500.

In this case, for example, the metallic burrs 96 (burrs 98) can be modified by the oxidizing agent included in the etchant 500, to suppress ductility of the metallic burrs 96 (burrs 98) and increase fragility of the metallic burrs 96 (burrs 98), and the metallic burrs 96 (burrs 98) can be removed by the ultrasonic vibration; at the same time, the burrs 96 (burrs 98) can be removed excellently by a shock wave that is produced when air bubbles (cavitation air bubbles) generated in the etchant 500 by the ultrasonic vibration rise in the processed grooves 95 (processed grooves 97) of the substrate 90, hit the burrs 96 (burrs 98), and are broken.

In addition, the contact of the etchant with the substrate 90 in the burr removing step is not limited to the form in which the substrate 90 is immersed in the tank 5 retaining the etchant 500. For example, after the frame unit 9 is mounted on the mounting table 52 of the tank 5, the etchant 500 may be longitudinally and laterally jetted from an ultrasonic vibration nozzle disposed above the tank 5 along the processed grooves 95 (processed grooves 97) of the substrate 90. In this case, for example, an amount of usage of the etchant 500 can be reduced. In addition, it is possible to suppress ductility of the burrs 96 (burrs 98) and increase fragility of the burrs 96 (burrs 98) by modifying the burrs 96 (burrs 98) by the oxidizing agent included in the etchant 500, and remove the burrs 96 from the chip 909 also by an impact produced when the etchant 500 jetted while an ultrasonic vibration is imparted thereto collides with the burrs 96.

As described above, a substrate processing method according to the present invention for processing the substrate 90 having the metals 905 formed on the planned dividing lines 904 along the planned dividing lines 904 includes the processed groove forming step of forming the processed grooves 95 by dicing, for example, in the substrate 90 along the planned dividing lines 904, and the burr removing step of, after the processed groove forming step is performed, making the etchant 500 that includes at least the oxidizing agent and to which an ultrasonic vibration is imparted come into contact with the substrate 90, suppressing ductility of the burrs 96 of the metals 905 and increasing fragility of the burrs 96, the burrs 96 being produced on the peripheries of the formed processed grooves 95, by modifying the burrs 96 by the oxidizing agent included in the etchant 500, and removing the burrs 96 by the ultrasonic vibration. It is thereby possible to remove the burrs 96 excellently, and to improve work efficiency of burr removal because a worker does not need to inspect the processed grooves 95 one by one for the presence or absence of the burrs 96.

In addition, when the etchant 500 used in the burr removing step includes the organic acid in addition to the oxidizing agent, an etching effect on the burrs 96 can be increased.

In addition, when the etchant 500 used in the burr removing step further includes the anticorrosive in addition to the oxidizing agent, unnecessary etching of the surfaces of the devices as product parts of the chips 909 can be retarded.

When the burr removing step immerses the substrate 90 in which the processed grooves 95 are formed or the plurality of chips 909 divided as individual pieces by the processed grooves 95 in the tank 5 retaining the etchant 500 and including the ultrasonic oscillating unit 53 that imparts an ultrasonic vibration, the burrs 96 can be removed excellently in a short period of time.

It is needless to say that the substrate processing method according to the present invention is not limited to the foregoing embodiments, and may be carried out in various different forms within the scope of the technical concept of the present invention. In addition, the configuration or the like of each apparatus used when the processing method is performed can also be modified as appropriate within a range in which effects of the present invention can be exerted.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A substrate processing method for processing a substrate having a metal formed on a planned dividing line along the planned dividing line, the substrate processing method comprising:
    a processed groove forming step of forming a processed groove in the substrate along the planned dividing line, wherein the substrate includes a bottom surface and an upper surface including at least one semiconductor device chip, and wherein a metallic burr is formed on a periphery of the processed groove during the forming of the processed groove; and
    a burr removing step of, after the processed groove forming step is performed, including:
        placing the substrate including the at least one semiconductor device chip in a tank having a mounting table and an ultrasonic oscillating unit, wherein the substrate is oriented upward so that the bottom surface of the substrate is on the mounting table, and wherein the mounting table includes an upper wall that is spaced from a bottom wall of the tank, and the ultrasonic oscillating unit is attached to a bottom surface of the upper wall of the mounting table,
        filling the tank with an etchant that includes at least an oxidizing agent until the substrate is immersed in the etchant and suppressing ductility of the metallic burr generated on a periphery of the formed processed groove and increasing fragility of the metallic burr by modifying the metallic burr using the oxidizing agent in the etchant, and
        removing the metallic burr by imparting an ultrasonic vibration generated by the ultrasonic oscillating unit on the substrate.

2. The substrate processing method according to claim 1, wherein the etchant further includes an organic acid.

3. The substrate processing method according to claim 1, wherein the etchant further includes an anticorrosive.

4. The substrate processing method according to claim 1, wherein the burr removing step includes immersing the substrate including a plurality of semiconductor device chips divided as individual pieces by t-processed grooves in the tank.

5. The substrate processing method according to claim 3, wherein a rate at which the metallic burrs are etched in the burr removing step is controlled by a composition ratio of the etchant including the oxidizing agent and at least either the organic acid or the anticorrosive.

6. The substrate processing method according to claim 1, further comprising discharging the etchant from the tank through a drainage port disposed at a position that is higher than an upper surface of the substrate.

7. The substrate processing method according to claim 1, wherein generating the ultrasonic vibration includes reflecting at least some of the ultrasonic vibration off of the bottom wall of the tank and imparting the reflected ultrasonic vibration on the substrate.

* * * * *